US008080286B2

(12) United States Patent
Giraud et al.

(10) Patent No.: US 8,080,286 B2
(45) Date of Patent: Dec. 20, 2011

(54) LOW DIELECTRIC CONSTANT SILICON COATING, METHOD FOR THE PREPARATION AND APPLICATION THEREOF TO INTEGRATED CIRCUITS

(75) Inventors: Yves Giraud, Sainte Foy les Lyons (FR); Carol Vergelatti, Sainte Baudille de la Tour (FR); Didier Tupinier, La Courneuve (FR); Ludovic Odoni, Rillieux la Pape (FR); Charlotte Basire, Marennes (FR); Lise Trouillet, Lyons (FR)

(73) Assignee: Bluestar Silicones France SAS (FR)

( * ) Notice: Subject to any disclaimer, the term of this patent is extended or adjusted under 35 U.S.C. 154(b) by 555 days.

(21) Appl. No.: 12/064,062

(22) PCT Filed: Aug. 16, 2006

(86) PCT No.: PCT/EP2006/065370
§ 371 (c)(1),
(2), (4) Date: Mar. 31, 2009

(87) PCT Pub. No.: WO2007/020273
PCT Pub. Date: Feb. 22, 2007

(65) Prior Publication Data
US 2009/0309195 A1    Dec. 17, 2009

(30) Foreign Application Priority Data
Aug. 19, 2005 (FR) ..................... 05 08637

(51) Int. Cl.
*B05D 3/02* (2006.01)
*C08J 7/18* (2006.01)
(52) U.S. Cl. .......... 427/387; 525/477; 528/43; 528/481; 427/379; 427/503; 427/595; 524/588

(58) Field of Classification Search .................. None
See application file for complete search history.

(56) References Cited

U.S. PATENT DOCUMENTS

| | | | |
|---|---|---|---|
| 4,255,316 A * | 3/1981 | Blizzard | 524/433 |
| 5,776,990 A | 7/1998 | Hedrick et al. | |
| 6,022,814 A | 2/2000 | Mikoshiba et al. | |
| 6,107,357 A | 8/2000 | Hawker et al. | |
| 6,211,307 B1 * | 4/2001 | Iwabuchi et al. | 525/477 |
| 6,214,748 B1 | 4/2001 | Kobayashi et al. | |
| 6,271,273 B1 * | 8/2001 | You et al. | 521/61 |
| 6,313,045 B1 | 11/2001 | Zong et al. | |
| 2001/0010840 A1 | 8/2001 | Kobayashi et al. | |
| 2003/0207595 A1 | 11/2003 | Ralamasu et al. | |

OTHER PUBLICATIONS

French Preliminary Search Report dated May 22, 2006 for Application No. FR 0508637.

* cited by examiner

*Primary Examiner* — Marc Zimmer
(74) *Attorney, Agent, or Firm* — Frost Brown Todd LLC

(57) ABSTRACT

The present invention concerns a process for the preparation of a silicone coating of low dielectric constant, comprising the following essential steps:
a) a film-forming silicone composition is deposited on the surface of a substrate, said silicone composition comprising: (i) at least one crosslinkable film-forming silicone resin, (ii) at least one α,ω-hydroxylated, essentially linear silicone oil capable of degrading under the action of heat, and (iii) at least one solvent capable of rendering the silicone resin (i) compatible with the silicone oil (ii),
b) the solvent (iii) is removed, preferably by heating, and, simultaneously or sequentially,
c) the film-forming silicone composition is cured by heating.

The invention deals also with a silicone coating obtained by this process and an integrated circuit comprising such a silicone coating as an electrical insulator.

14 Claims, No Drawings

LOW DIELECTRIC CONSTANT SILICON COATING, METHOD FOR THE PREPARATION AND APPLICATION THEREOF TO INTEGRATED CIRCUITS

FIELD OF THE INVENTION

The invention relates to the field of interconnecting materials, especially for the manufacture of integrated circuits by optical lithography. More particularly, the invention relates to a silicone coating of low dielectric constant and to a process for the preparation of such a coating.

CONTEXT OF THE INVENTION

The search for fast and compact integrated circuits requires the development of transistors of reduced dimensions.

As a constituent element of prime importance in an integrated circuit, the interconnection manages all the exchanges and data between the transistors and the other microcomponents within the integrated circuit. The interconnection is a complex assembly of deposited and then etched layers which obey certain rules of alternation between:

- metallic conducting lines or current-carrying lines, made of aluminum (Al) in the old generations of microprocessors, which convey the electric signal in the circuit, and
- insulating layers between current-carrying lines, consisting of silica ($SiO_2$), which, by separating the metallic conducting lines, limit the diffusion of metallic species and thereby contribute to the stability of the signal.

The technical performance characteristics of the $Al/SiO_2$ couple were perfectly capable of responding to the change in miniaturization technologies over several generations of chips and microcomponents, until the emergence of the 180 nm generation contributed to the identification of a major technical obstacle.

The smaller the transistors incorporated in the integrated circuit, the greater is the switching speed between transistors. In other words, the gate delay (GD) decreases. At the same time, the total length of the electrical connections increases, so the interconnect delay (ID) increases.

In the $Al/SiO_2$ association, in the case of the generations having dimensions greater than 180 nm—i.e. the older generations—it is the switching speed that limits the speed gains of the microprocessors. By contrast, in the case of the generations having dimensions below 180 nm—i.e. the more recent generations—the interconnection speed becomes a limiting factor in relation to the switching speed between transistors.

This phenomenon entails potential risks of power dissipation, signal distortion and partial energy transfer between lines (crosstalk), i.e. overall decrease in the performance characteristics of the circuit.

As a matter of interest, in the field of semiconductors, the value that designates a generation of chips (e.g. 180 nm) reflects half the pitch of the interconnection, i.e. half the sum of the mean thickness of the insulating layer and the mean thickness of the associated metallic line.

To overcome this technical obstacle, a first proposal consisted in progressively replacing the aluminum of the metallic conducting lines (resistivity $R_{Al}$=3.1 $\Omega$·cm) with a metal of lower resistivity, such as copper (resistivity $R_{Cu}$=1.7 $\Omega$·cm).

The second proposal involved the insulating layers between current-carrying lines. It was suggested to replace the silica (relative dielectric constant $K_{SiO2}$=4.1) with materials of low dielectric constant, i.e. materials whose dielectric constant should be below 3.0 for the needs of the future generations of interconnections. In fact, the interconnect delay of a circuit correlates with the capacitance of the circuit, which itself is related to the dielectric constant of the insulating layers.

PRIOR ART

To obtain interconnecting materials possessing a low dielectric constant, it is necessary to reduce the density of chemical bonds within the material, either by reducing the density of the material or by rendering the material porous.

Numerous porous dielectric materials have been proposed in this field. The choice fell essentially on closed-porosity materials, on the one hand to avoid the risk of migration of metallic species across the insulating layers, and on the other hand for reasons of mechanical strength. Many ways of obtaining a closed porosity have been developed recently. The following may be mentioned among these:

U.S. Pat. No. 6,214,748 relates to a method of forming a thin film on a substrate. This film is produced by applying a solution comprising an electrically insulating, thermally crosslinkable resin and a mixture of solvents, one of which has a high boiling point. The first, main solvent is removed by conventional drying of the deposit at a temperature of 100 to 120° C. The second, subordinate solvent volatilizes during the high-temperature treatment above 300° C. This volatilization of the subordinate solvent generates a porosity in the body of the layer.

U.S. Pat. No. 6,107,357 relates to the manufacture of a dielectric material from a composition which is prepared by grafting onto a silicone resin an organic unit that forms pores at high temperature, by way of a coupling agent. After a film has been formed from this composition, it is subjected to a high temperature in order to decompose the pore-forming agent.

U.S. Pat. No. 6,022,814 relates to a porous dielectric material generated from a mixture of silicone resins carrying thermally labile groups. A film of this material is formed by depositing a layer of the mixture and then heating in order to remove the thermally labile groups and generate the porosity.

U.S. Pat. No. 5,776,990 relates to a porous dielectric material manufactured from a copolymer of a polymer matrix and a polymer that is thermally decomposable at a temperature below the degradation point of the polymer matrix. The copolymer is sequenced, so it forms mutually separate microphases. Under the effect of heat, the thermally decomposable part is removed.

American patent application US-A-2001/0010840 relates to a composition based on a silicone resin. This composition comprises an electrically insulating resin carrying hydrogen atoms bonded to a silicon atom, and a compound carrying groups capable of reacting with hydrogen atoms bonded to a silicon atom of the resin, whose boiling point under atmospheric pressure is above 250° C. The composition also comprises a solvent. The coating is formed by depositing a layer of the composition on a substrate and then heating it to a high temperature or subjecting it to high-energy radiation. This causes crosslinking of the resin and the compound capable of reacting with the hydrogen atoms bonded to the silicon of the resin, as well as evaporation of the solvent.

American patent application US-A-2003/0207595 relates to the manufacture of a material of low dielectric constant for semiconductors. This material is obtained from a hybrid mixture of a silicone resin and an amphiphilic "sacrificial" organic polymer, which in this case is a sequenced copolymer. One of the blocks of the copolymer is miscible with the silicone resin, whereas the other block of the copolymer is not. Thus the immiscible component of the copolymer initiates a microseparation of phases with the silicone resin, whereas the other component of the copolymer makes it possible to limit this microseparation. The immiscible phase is removed in a high-temperature heating step to generate the desired porosity.

OBJECT OF THE INVENTION

One object of the present invention is to propose a process for the preparation of a coating of low dielectric constant for applications in the field of integrated circuits. 'Low dielectric constant' is understood in particular as meaning materials whose relative dielectric constant is less than or equal to 3.

Another object of the invention is to propose a process for the preparation of a coating of low dielectric constant in the form of a thin film which is compatible with the development of semiconductors of the 180 nm generation and later generations.

Yet another object of the invention is to propose a process for the preparation of a coating of low dielectric constant which can be adapted to the mass production processes known hitherto.

Another object of the invention is to propose a process for the preparation of a coating of low dielectric constant which is thermally stable at high temperature.

An additional object of the invention is to propose a process for the preparation of a coating of low dielectric constant which is easy to carry out and of controlled cost.

Yet another object of the invention is to propose a process for the preparation of a nanoporous silicone coating of low dielectric constant, preferably a process by means of which the size of the pores can be controlled.

An additional object of the invention is to propose a process for the preparation of a silicone coating of low dielectric constant which uses readily available products.

Yet another object of the invention is to provide a novel interconnecting material which is useful for the development of the new generations of integrated circuit, particularly the 180 nm and smaller generations and especially the 60 nm generation.

Other objects and advantages of the present invention will become apparent from the description which follows.

BRIEF DESCRIPTION OF THE INVENTION

It is to the inventors' credit to have developed a novel process for the preparation of a silicone coating of low dielectric constant which makes it possible to achieve the objects referred to above, among others. This process comprises the following essential steps:

a) a film-forming silicone composition is deposited on the surface of a substrate, said silicone composition comprising: (i) at least one crosslinkable film-forming silicone resin, (ii) at least one α,ω-hydroxylated, essentially linear silicone oil capable of degrading under the action of heat, and (iii) at least one solvent capable of rendering the silicone resin (i) compatible with the silicone oil (ii), b) the solvent (iii) is removed, preferably by heating, and, simultaneously or sequentially, c) the film-forming silicone composition is cured by heating.

The invention further relates to a silicone coating obtainable by such a preparative process, and to an integrated circuit comprising such a silicone coating as an electrical insulator.

The invention further relates to the use of a silicone composition comprising: (i) at least one crosslinkable film-forming silicone resin, (ii) at least one α,ω-hydroxylated, essentially linear silicone oil capable of degrading under the action of heat, and (iii) at least one solvent capable of rendering the silicone resin (i) compatible with the silicone oil (ii), for the preparation of a coating of low dielectric constant, especially in an integrated circuit.

DETAILED DESCRIPTION OF THE INVENTION

In the remainder of the present patent application, the silicone oils and resins will be described in conventional manner by the following customary rotations used to denote various siloxy units:

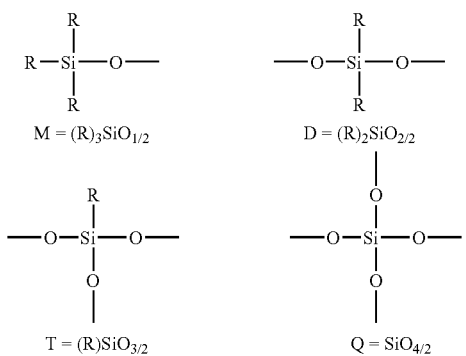

In these units, R can be a variety of saturated or unsaturated hydrocarbon groups, especially aromatic groups, optionally substituted by heteroatoms, and, in particular, non-hydrocarbon groups. The meaning of R will be indicated in the description.

Conventionally, in this notation, the oxygen atoms are shared between two silicon atoms. Conventionally, a particular group R is indicated by showing it as an exponent after the symbol M, D or T. For example, $M^{OH}$ represents a unit M in which a group R is a hydroxyl group (—OH). Similarly, $D^{Phe2}$ represents a unit D in which the two groups R are phenyl groups (—$C_6H_5$) (abbreviated to Phe). $T^{Me}$ represents a unit T in which the group R is a methyl group (—$CH_3$) (abbreviated to Me).

The invention relates first and foremost to a process for the preparation of a silicone coating of low dielectric constant. While retaining the object of developing a porosity that allows an effective reduction in the dielectric constant of the initial material, and at the same time having adequate mechanical characteristics, the inventors exploited a property of some silicone oils which had hitherto been considered a disadvantage, namely the reversion, at high temperature, of hydroxylated, essentially linear silicone oils to rings generally containing 4 to 5 siloxy units.

'Essentially linear' shall be understood as meaning a silicone oil carrying less than 2 mol %, preferably less than 1.5 mol % and particularly preferably less than 1 mol % of units T.

Briefly, the process consists essentially in solubilizing, in a solvent, a silicone resin preferably carrying methyl and phenyl groups, and a silicone oil, preferably a polydimethylsiloxane (PDMS) with α,ω-hydroxylated ends. This film-forming silicone composition is deposited on a substrate by a technique known per se as spin coating, and the solvent is then removed under the action of heat. During this drying step (baking), a demixing of the silicone resin phase and the silicone oil phase is observed. This demixing is probably limited by gelling and then crosslinking of the resin. Finally, the coating is treated at very high temperature (curing). This treatment causes the film to crosslink by condensation of the residual —OH groups of the silicone resin. Also, the porosity is generated inside the layer by thermal degradation of the 'sacrificial' silicone oil. The silicone oil converts almost spontaneously from an essentially linear structure to a volatile cyclic structure. On evaporation, these cyclic compounds give way to pores distributed throughout the bulk of the film of silicone resin.

The crosslinkable film-forming resin(s) (i) (the singular will be used) is an organosilicone resin prepared by the co-hydrolysis and co-condensation of chlorosilanes selected from the group comprising $(R)_3SiCl$, $(R)_2SiCl_2$, $(R)SiCl_3$ and $SiCl_4$. These resins are well-known branched organopolysiloxane oligomers or polymers that are commercially available. Their structure contains at least two different siloxy units selected from the units M, D, T and Q defined above, including at least one unit T or one unit Q. The radicals R are distributed in such a way that the resins contain about 0.8 to 1.8 radicals R per silicon atom.

The radicals R are mutually identical or different. They are selected from linear or branched C1 to C6 alkyl radicals, linear or branched C2 to C4 alkenyl radicals and C6 to C10 aryl and aralkyl radicals, the radicals R optionally being halogenated (preferably fluorinated). Alkyl radicals R which may be mentioned very particularly are methyl, ethyl, isopropyl, tert-butyl and n-hexyl radicals and the 3,3,3-trifluoropropyl radical; alkenyl radicals which may be mentioned very particularly are vinyl, allyl, propenyl, butenyl and butadienyl radicals; and aryl and aralkyl radicals which may be mentioned very particularly are phenyl, benzyl, styryl, phenethyl, cumenyl, mesityl, tolyl and xylyl radicals. Whatever the case may be, at least one radical R per molecule is an aryl or aralkyl radical, preferably a phenyl or benzyl radical.

Furthermore, these resins are not completely condensed: they still have about 0.001 to 1.5 hydroxyl groups (—OH) and/or alkoxy groups —$OR^1$ per silicon atom. The radicals $R^1$ are mutually identical or different, are selected from linear or branched C1 to C6 alkyl radicals and are defined in the same way as the alkyl radicals R. Preferably, the alkoxy groups —$OR^1$ are selected from methoxy, ethoxy, butoxy, isopropoxy, isobutoxy, sec-butoxy and tert-butoxy groups and mixtures thereof.

Examples of branched organopolysiloxane oligomers or polymers which may be mentioned are the resins MQ, the resins MDQ, the resins TD, the resins MDT and the resins MDTQ. The OH and/or $OR^1$ groups can be carried by the units M, D and/or T. The proportion by weight of OH and/or $OR^1$ groups is between 0.2 and 10%, based on the weight of the resin.

The methyl radical is more particularly preferred as the alkyl radical R. The phenyl radical is more particularly preferred as the aryl radical R. The methyl or ethyl radical is more particularly preferred as the alkyl radical $R^1$.

In one preferred variant, at least one of the radicals R per molecule is a phenyl radical. Preferably, the phenyl radical is carried by a unit D (unit $D^{Phe}$) and/or by a unit T (unit $T^{Phe}$). Thus, according to the invention, the silicone resin (i) advantageously contains at least two of the units $D^{Phe}$, T and $T^{Phe}$. The silicone resin (i) can also contain units $D^{Phe2}$.

According to another characteristic, the silicone resin (i) contains at least three hydroxyl groups (—OH) and/or groups —$OR^1$ per molecule, preferably at least three hydroxyl groups (—OH), each of them being bonded to a silicon atom. Advantageously, the proportion by weight of hydroxyl groups (—OH) in the silicone resin (i) is less than 2%.

As far as the silicone oil (ii) is concerned, this is preferably an α,ω-hydroxylated, essentially linear polydiorganosiloxane oil. Advantageously, it is an essentially linear polydimethylsiloxane oil of the general formula $M^{OH}$-$(D^{Me2})_n$-$M^{OH}$, in which n varies from 1 to 20.

As mentioned above, the silicone oil can comprise preferably less than 2 mol % of units T, particularly $T^{Me}$.

The silicone oil (ii) is capable of degrading at elevated temperature to form cyclic compounds generally containing from 3 to 10 dialkylsiloxy units D and most frequently 4, 5 or 6 units D. This reversion occurs as from temperatures of 150 to 160° C.

The third essential component of the film-forming silicone composition is a solvent (iii), or a mixture of solvents, that is capable of rendering the silicone resin (i) compatible with the silicone oil (ii). Said solvent is preferably an organic solvent. The nature of the solvent is not subject to any particular restrictions, provided that it favors the mixing of the silicone resin (i) and the silicone oil (ii) without reacting with the latter. Examples of solvents which may be mentioned are aromatic solvents such as toluene or xylene; aliphatic solvents such as hexane, heptane or octane; ketone solvents; and esters. Aromatic solvents are preferred.

The silicone composition preferably comprises from 4 to 9 parts by weight of silicone resin (i) per part by weight of silicone oil (ii), i.e. a weight ratio (i)/(ii) varying from 4/1 to 9/1.

The preparative process will now be described in greater detail, especially as regards the envisaged thermal cycle. First of all, as has been indicated, a layer of the film-forming silicone composition is deposited on the surface of a substrate, e.g. a silica wafer. The deposition technique is known per se, namely spin coating.

The solvent (iii) is then removed, the simplest method consisting in heating the deposit of silicone composition so as to vaporize the solvent under the action of heat. Advantageously, this step for removal of the solvent (iii) is carried out under vacuum, preferably at a temperature Tb (baking temperature) that is above the vaporization point of the solvent and optionally below the degradation point of the silicone oil (ii). In the course of this solvent removal step, which can be considered as a drying step, a demixing of the silicone resin phase (i) and silicone oil phase (ii) may be observed at the same time as the gelling of the composition. The temperature Tb depends on the vaporization point of the solvent (iii) and its value generally varies from 100° C. to 160° C.

During the next step, a high-temperature treatment (curing) is carried out on the layer of silicone composition, on the one hand to remove the traces of solvents, and on the other hand to cure the film-forming silicone composition. During this curing, the silicone resin condenses by elimination of the residual —OH and/or —$OR^1$, groups. Moreover, the silicone oil (ii) undergoes a thermal reversion: it degrades to form cyclic compounds of the cyclodialkylsiloxane type containing from 3 to 10 dialkylsiloxy units. These units generally evaporate as from 160° C. Given that the composition has undergone gelling during the preceding baking step, and by virtue of the crosslinking of the layer of silicone composition, the volatilization of the cyclic compounds gives way to an assembly of pores distributed throughout the body of the crosslinked composition.

Advantageously, the curing of the film-forming silicone composition is carried out by heating to a temperature Tc that is above the degradation point of the silicone oil (ii). The temperature Tc is above or equal to 300° C. and preferably above or equal to 350° C. It is below the thermal degradation point of the substrate and the silicone resin, i.e. the temperature Tc is below or equal to 500° C. and preferably below or equal to 400° C.

In another variant of the preparative process, the two steps referred to above (baking and curing) are carried out simultaneously by direct heating of the film-forming silicone composition deposited on the surface of the substrate, at a temperature Tc that is above the degradation point of the silicone oil (ii) and the vaporization point of the solvent (iii). This flash treatment is very rapid and affords a much finer porosity.

In the two variants described above, the heating step(s) is (are) preferably carried out by means of electromagnetic radiation, e.g. high-frequency radiation or microwave radiation. Heating processes of this type are well known in industry and their value lies in the fact that they allow a direct transfer of energy with a high power density per unit volume.

According to a second feature, the invention relates to a silicone coating obtainable by carrying out a process according to the invention. As shown in the Examples illustrating the invention, such silicone coatings have a relative dielectric constant K that is less than or equal to 3.00. K is preferably less than or equal to 2.85 and particularly preferably less than or equal to 2.65. Such materials are thus of particular value as interconnecting materials for the manufacture of integrated circuits.

In addition, it is entirely possible to use a silicone composition such as described above in order to produce coatings having a thickness less than or equal to 3200 nm, preferably less than or equal to 2000 nm, 500 nm or even 150 nm.

According to another characteristic of the invention, a silicone coating obtained by carrying out a process according to the invention comprises pores with a median diameter in the order of 250 nm, preferably below 250 nm. Particularly preferably, the median pore diameter is between 50 nm and 180 nm.

The invention further relates to an integrated circuit comprising a silicone coating such as described above as an electrical insulator. The manufacture of integrated circuits is widely documented. The technique of optical lithography, to mention but one, is particularly suitable.

EXAMPLES

The preparative process according to the invention and the silicone coatings thereby obtained will be illustrated by the Examples below, without limiting its scope.

Deposition by the Spin Coating Technique

The glass plates which constitute the substrates for the deposits (24×32 mm cover slips) are first degreased with acetone and methanol. They then have to be metallized (metallization time: 6 min) to allow subsequent measurement of the capacitance K of the final coating. To be suitable for treatment in the spin coater, the glass slides are glued to metal disks 50 mm in diameter, electrical contact between conducting and insulating surfaces being provided by a very thin deposit of silver lacquer.

A few drops of the silicone composition are deposited on the cover slip, placed on its disk inside the spin coater. The latter is gradually brought to a speed of 2000 rpm over 20 sec and then increases to a constant speed of 5000 rpm over 30 sec. An average of ten samples are produced in this way so that the characterization and measurement statistics obtained are sufficiently processable and reliable (deviation of ±0.10 observed on the measured value of the dielectric constant).

Determination of the Mean Thickness of the Coatings

The technique of scanning microscopy makes it possible to measure the thickness of the coating on condition that the sample studied is appropriately prepared (an incision is made in the glass slide, the slide is broken and the slice is then observed).

Evaluation of the Capacitance and Dielectric Constant of the Coatings

The capacitance of the coating is measured using an Agilent 16451B dielectric measuring cell having a reference electrode of diameter 5 mm. These measurements are made under a 50 Hz to 1 MHz frequency scan (1 MHz being the frequency on the specifications sheet of manufacturers of interconnecting materials). If the thickness of the coating is known, the dielectric constant (K) is very easily deduced from the value of the capacitance of the deposit:

$$K = \frac{e \cdot C}{\varepsilon_0 \cdot A}$$

in which:
e=thickness of coating (m)
C=capacitance (Farad)
A=area of electrode (m$^2$)
$\varepsilon_0$=permittivity of air ($\varepsilon_0$=8.854·10$^{-12}$ Farad/m)

By convention, in the Examples, if the nature of one or more groups R of the units M, D and T is not specified, then the groups R whose nature has not been specified are methyl groups.

A/Resins Deposited as Such and not Giving Rise to Internal Porosity (Counter-Examples)

The silicone compositions according to Examples 1 and 2 do not contain silicone oil (ii). The development of a porosity is not observed within the films obtained from these silicone compositions.

Example 1

A silicone resin of the formula $(D^{Phe2})_{10}(D)_{30}(T^{Phe})_{57}(T)_3$ is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are then dried in a vacuum oven at 120° C. for 1 hour. A nitrogen sweep at the end of the evacuation cycle under a low line-vacuum of about 10 mm Hg makes it possible to eliminate the presence of any trace of oxygen. All the deposits are finally placed in an oven and cured at 350° C. for 1 hour under a constant nitrogen sweep.

The resulting films have a thickness of between 140 and 480 nm. The mean dielectric constant of these films, measured at 1 MHz, is 2.80 (±0.10).

Example 2

A silicone resin of the formula $(T)_{34}(D^{Phe})_{31}(T^{Phe})_{35}$ is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are then dried in a vacuum oven at 120° C. for 1 hour. A nitrogen sweep at the end of the evacuation cycle under a line-vacuum makes it possible to eliminate the presence of any trace of oxygen. All the deposits are finally placed in an oven and cured at 350° C. for 1 hour under a constant nitrogen sweep.

The resulting films have a thickness of between 580 and 1800 nm. The mean dielectric constant of these films, measured at 1 MHz, is 2.85 (±0.10).

B/Mixtures of Silicone Resin and Hydroxylated Silicone Oil (Examples According to the Invention)

Examples 3 to 6 make it possible to compare two treatments, namely a two-step treatment comprising baking followed by curing, or a one-step flash treatment, as well as two resin/oil ratios in the silicone composition.

Example 3

Two-Step Treatment Comprising Baking and Curing

A mixture consisting of a silicone resin of the formula $(T)_{34}(D^{Phe})_{31}(T^{Phe})_{35}$ and an $\alpha,\omega$-dihydroxylated silicone oil of the formula $(M^{OH})(D)_{4.5}(M^{OH})$, in a weight ratio resin/oil of 80/20, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are then dried in a vacuum oven at 120° C. for 1 hour. A nitrogen sweep at the end of the evacuation cycle under a line-vacuum makes it possible to eliminate the presence of any trace of oxygen. All the deposits are finally placed in an oven and cured at 350° C. for 1 hour under a constant nitrogen sweep.

The resulting films have a thickness of between 350 and 780 nm and a closed internal porosity whose mean diameter is in the order of 250 nm. The mean dielectric constant of these films, measured at 1 MHz, is 2.38 (±0.10).

Example 4

Flash Treatment

A mixture consisting of a silicone resin of the formula $(T)_{34}(D^{Phe})_{31}(T^{Phe})_{35}$ and an $\alpha,\omega$-dihydroxylated silicone oil of the formula $(M^{OH})(D)_{4.5}(M^{OH})$, in a weight ratio resin/oil of 80/20, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are placed directly in an oven and cured at 350° C. for 1 hour under a constant nitrogen sweep.

The resulting films have a thickness of between 350 and 780 nm and a closed internal porosity whose mean diameter is in the order of 100 nm. The mean dielectric constant of these films, measured at 1 MHz, is 2.42 (±0.10).

Example 5

Two-Step Treatment Comprising Baking and Curing

A mixture consisting of a silicone resin of the formula $(T)_{34}(D^{Phe})_{31}(T^{Phe})_{35}$ and an $\alpha,\omega$-dihydroxylated silicone oil of the formula $(M^{OH})(D)_{4.5}(M^{OH})$, in a weight ratio resin/oil of 90/10, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are then dried in a vacuum oven at 120° C. for 1 hour. A nitrogen sweep at the end of the evacuation cycle under a line-vacuum makes it possible to eliminate the presence of any trace of oxygen. All the deposits are finally placed in an oven and cured at 350° C. for 1 hour under a constant nitrogen sweep.

The resulting films have a thickness of between 300 and 800 nm and a closed internal porosity whose mean diameter is in the order of 180 nm. The mean dielectric constant of these films, measured at 1 MHz, is 2.65 (±0.10).

Example 6

Flash Treatment

A mixture consisting of a silicone resin of the formula $(T)_{34}(D^{Phe})_{31}(T^{Phe})_{35}$ and an $\alpha,\omega$-dihydroxylated silicone oil of the formula $(M^{OH})(D)_{4.5}(M^{OH})$, in a weight ratio resin/oil of 90/10, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are placed directly in an oven and cured at 350° C. for 1 hour under a constant nitrogen sweep.

The resulting films have a thickness of between 300 and 800 nm and a closed internal porosity whose mean diameter is in the order of 50 nm. The mean dielectric constant of these films, measured at 1 MHz, is 2.60 (±0.10).

C/Mixtures of Silicone Resin and Non-Hydroxylated Silicone Oil (Counter-Examples)

Examples 7 and 8 demonstrate the importance of choosing the silicone oil from hydroxylated silicone oils.

Example 7

A mixture consisting of a silicone resin of the formula $(T)_{34}(D^{Phe})_{31}(T^{Phe})_{35}$ and a silicone oil with trimethyl end groups of the formula $(M)(D)_4(M)$, in a weight ratio resin/oil of 90/10, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are then dried in a vacuum oven at 120° C. for 1 hour. A nitrogen sweep at the end of the evacuation cycle under a line-vacuum makes it possible to eliminate the presence of any trace of oxygen. All the deposits are finally placed in an oven and cured at 350° C. for 1 hour under a constant nitrogen sweep.

The resulting films have a thickness of between 350 and 750 nm, but have no internal porosity.

Example 8

A mixture consisting of a silicone resin of the formula $(T)_{34}(D^{Phe})_{31}(T^{Phe})_{35}$ and a silicone oil with trimethyl end groups of the formula $(M)(D)_4(M)$, in a weight ratio resin/oil of 90/10, is first diluted to 20% by weight in toluene. A few drops of the solution are deposited on a glass slide, which itself is glued to a metal disk 50 mm in diameter, the whole being placed in a spin coater. The latter is gradually brought to a speed of 2000 rpm over 20 sec and then remains at a constant speed of 5000 rpm for 30 sec. Ten deposits of the same solution are produced consecutively according to the described protocol.

All the deposits are placed directly in an oven and cured at 350° C. for 1 hour under a constant nitrogen sweep.

The resulting films have a thickness of between 350 and 750 nm, but have no internal porosity.

CONCLUSION

The above Examples demonstrate that, all other things being equal, reducing the amount of silicone oil in the starting mixture makes it possible substantially to reduce the size of the pores in the coating.

Moreover, applying a thermal flash to the deposit, rather than preparing the deposit in two successive heating steps (baking and then curing), also makes it possible to reduce the pore size.

Furthermore, the absence of silicone oil in the composition, or the incorporation of non-hydroxylated linear silicone oil into the composition, produces non-porous coatings, independently of the preparative protocol (two-step or flash treatment).

The invention claimed is:

1. Process for the preparation of a silicone coating of low dielectric constant, comprising the steps of
   a) depositing a film-forming silicone composition on the surface of a substrate, said silicone composition comprising: (i) at least one crosslinkable film-forming silicone resin, (ii) at least one α,ω-hydroxylated, essentially linear silicone oil capable of degrading under the action of heat, and (iii) at least one solvent capable of rendering the silicone resin (i) compatible with the silicone oil (ii),
   b) removing the solvent (iii), and, simultaneously or sequentially,
   c) curing the film-forming silicone composition by heating;
   wherein said silicone coating comprises pores with a median size of about 250 nm or below.

2. Process according to claim 1 wherein the solvent (iii) is removed by vaporization, the silicone composition being heated to a temperature Tb that is above the vaporization point of the solvent (iii) and below the degradation point of the silicone oil (ii).

3. Process according to claim 1 wherein the film-forming silicone composition is cured by heating to a temperature Tc that is above the degradation point of the silicone oil (ii).

4. Process according to claim 1 wherein the solvent (iii) is removed by vaporization, the silicone composition being heated, and the film-forming silicone composition is cured by heating to a temperature Tc that is above the degradation point of the silicone oil (ii) and the vaporization point of the solvent (iii).

5. Process according to claim 2 wherein the temperature Tb is between about 100° C. and about 160° C.

6. Process according to claim 3 wherein the temperature Tc is above or equal to about 300° C., and below the thermal degradation point of the substrate and the silicone composition.

7. Process according to claim 6 wherein the temperature Tc is below or equal to about 500° C.

8. Process according to claim 1 wherein at least one heating step is carried out by means of electromagnetic radiation.

9. Process according to claim 1 wherein the silicone resin (i) has the following per molecule:
   at least two different siloxy units selected from the units M, D, T and/or Q, at least one of these units being a unit T or Q, of the formulae:

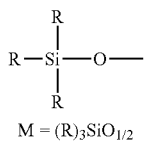
$M = (R)_3SiO_{1/2}$

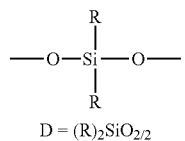
$D = (R)_2SiO_{2/2}$

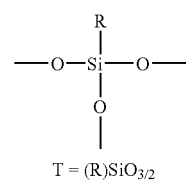
$T = (R)SiO_{3/2}$

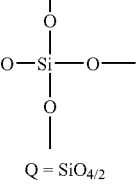
$Q = SiO_{4/2}$ and at least three hydrolyzable/condensable groups —OH and/or —OR¹, in which the radicals R are mutually identical or different and are a linear or branched C1 to C6 alkyl group, a linear or branched C2 to C4 alkenyl group, a C6 to C10 aryl group or a C6 to C10 aralkyl group, the radicals R optionally being halogenated and at least one of the radicals R being an aryl or aralkyl group, and in which the radicals R¹ are mutually identical or different and are a linear or branched C1 to C6 alkyl group.

10. Process according to claim 9 wherein the silicone resin (i) contains up to 2% by weight of hydroxyl groups.

11. Process according to claim 9 wherein the silicone resin (i) contains at least two of the units $D^{Phe}$, T and $T^{Phe}$.

12. Process according to claim 1 wherein the silicone oil (ii) is an essentially linear polydiorganosiloxane oil with hydroxylated end groups.

13. Process according to claim 1 wherein the weight ratio (i)/(ii) of the silicone resin (i) to the silicone oil (ii) varies between about 4/1 and about 9/1.

14. Process according to claim 1 wherein the solvent (iii) is an organic solvent selected from aromatic solvents, aliphatic solvents, ketone solvents, esters, and mixtures thereof.

* * * * *